(12) United States Patent
Huang

(10) Patent No.: US 9,252,074 B2
(45) Date of Patent: Feb. 2, 2016

(54) HEAT DISSIPATING DEVICE

(71) Applicant: Amtek Semiconductors Co., Ltd., New Taipei (TW)

(72) Inventor: Chien-Ping Huang, New Taipei (TW)

(73) Assignee: Amtek Semiconductors Co., Ltd., New Taipei (TW)

( * ) Notice: Subject to any disclaimer, the term of this patent is extended or adjusted under 35 U.S.C. 154(b) by 143 days.

(21) Appl. No.: 14/067,004

(22) Filed: Oct. 30, 2013

(65) Prior Publication Data

US 2014/0203425 A1  Jul. 24, 2014

Related U.S. Application Data

(63) Continuation-in-part of application No. 13/860,796, filed on Apr. 11, 2013.

(30) Foreign Application Priority Data

Jan. 23, 2013  (TW) .............. 102102421 A

(51) Int. Cl.
| | |
|---|---|
| *H01L 23/34* | (2006.01) |
| *H01L 23/467* | (2006.01) |
| *H01L 23/00* | (2006.01) |
| *H01L 23/31* | (2006.01) |

(52) U.S. Cl.
CPC .............. *H01L 23/467* (2013.01); *H01L 24/97* (2013.01); *H01L 23/3121* (2013.01); *H01L 2224/48091* (2013.01); *H01L 2224/48227* (2013.01); *H01L 2924/19105* (2013.01)

(58) Field of Classification Search
CPC ................................................... H01L 23/467
USPC ................................. 257/706, 713, E23.099
See application file for complete search history.

(56) References Cited

U.S. PATENT DOCUMENTS

| | | | | |
|---|---|---|---|---|
| 5,297,005 | A | * | 3/1994 | Gourdine ...................... 361/697 |
| 5,335,722 | A | * | 8/1994 | Wu .............................. 165/122 |
| 5,370,178 | A | * | 12/1994 | Agonafer et al. ............. 165/137 |
| 5,630,469 | A | * | 5/1997 | Butterbaugh et al. ........ 165/80.3 |
| 6,111,748 | A | * | 8/2000 | Bhatia ........................... 361/695 |
| 6,411,511 | B1 | * | 6/2002 | Chen ............................. 361/697 |
| 6,799,282 | B2 | | 9/2004 | Maeda et al. |
| 7,215,548 | B1 | | 5/2007 | Wu et al. |
| 7,286,357 | B2 | | 10/2007 | Wung et al. |
| 7,345,884 | B2 | | 3/2008 | Horng et al. |
| 7,568,517 | B2 | | 8/2009 | Hwang et al. |
| 2004/0050536 | A1 | * | 3/2004 | Watanabe ............. H01L 23/467 165/104.33 |
| 2005/0099774 | A1 | * | 5/2005 | Song ............................. 361/700 |
| 2007/0217149 | A1 | * | 9/2007 | Horng ................. F04D 25/0633 361/695 |
| 2009/0168353 | A1 | * | 7/2009 | Kato ............................. 361/697 |

* cited by examiner

*Primary Examiner* — Nitin Parekh
(74) *Attorney, Agent, or Firm* — Mintz Levin Cohn Ferris Glovsky and Popeo, P.C.; Peter F. Corless; Steven M. Jensen

(57) ABSTRACT

A heat dissipating device includes a semiconductor packaging structure having a stator set and a semiconductor element provided therein, a fan wheel set pivotally connected to the semiconductor packaging structure, and a guiding structure having a guiding channel. The guiding structure receives the semiconductor packaging structure and the fan wheel set. The fan wheel set includes a plurality of blades located above the surface of the semiconductor packaging structure. The stator set and the semiconductor element controls the first blades. The blades extend beyond side surfaces the semiconductor packaging structure and have their sizes increased, such that the airflow volume can be increased without changing the size of the semiconductor packaging structure.

11 Claims, 7 Drawing Sheets

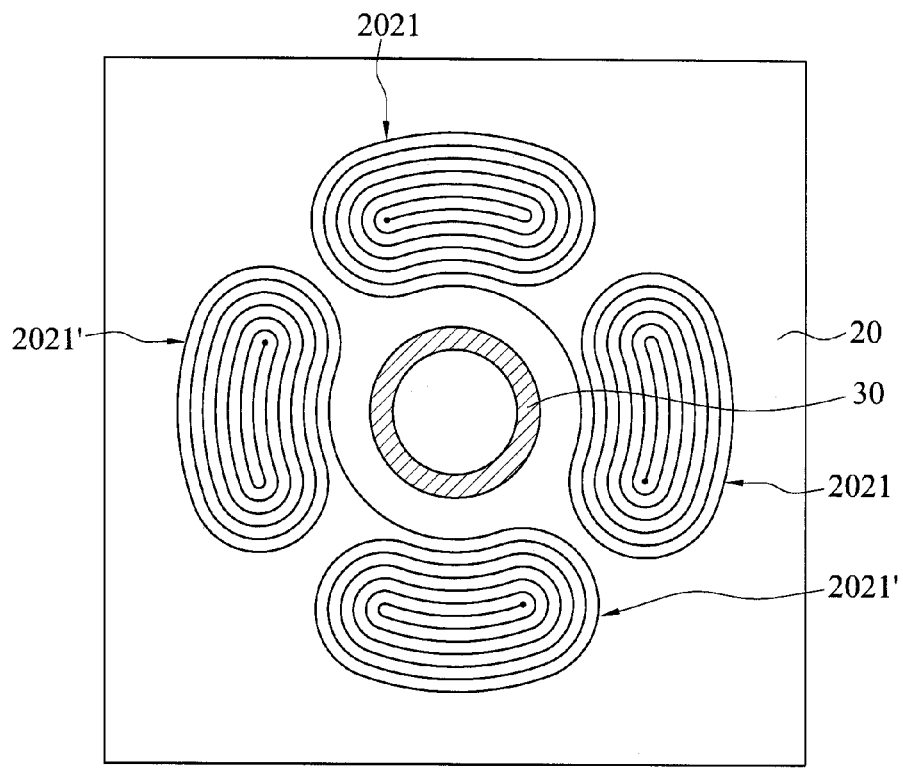
FIG. 2B'
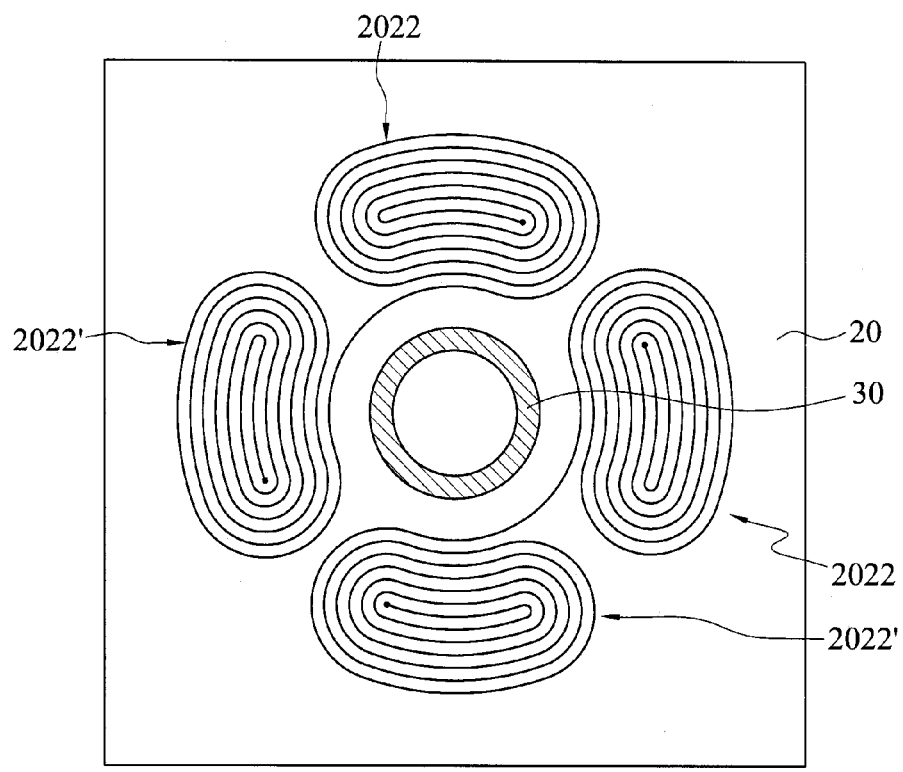
FIG. 2B"

HEAT DISSIPATING DEVICE

CROSS-REFERENCE TO RELATED APPLICATIONS

This application is a continuation-in-part application of U.S. application Ser. No. 13/860,796 filed on Apr. 11, 2013, which is hereby incorporated by reference herein.

FIELD OF THE INVENTION

The present invention relates to heat dissipating devices, and, more particularly, to a heat dissipating device including a semiconductor packaging structure.

BACKGROUND OF THE INVENTION

A circuit board, such as a main board or a mother board, typically has a plurality of electronic components, such as a central processing unit or a graphic card, provided thereon, and conductive circuits that electrically connect the electronic components. The electronic components generate heat during operations, and if the heat generated is not dissipated from an electronic product in which the circuit board is provided, the electronic components may be overheated and fail. Such a problem becomes more prominent in the face of increasing demands for functions and processing speeds, because enhancement in the functions and processing speeds of the circuit boards means that the electronic components integrated on the circuit boards will need to be more or higher end. More or higher end electronic devices generate more heat. Therefore, effectively dissipating the heat generated from the circuit board is a necessary design consideration.

One of the approaches to dissipate heat that is commonly used in the industry involves installing a cooling fan on the main board or the mother board to dissipate the heat generated by the electronic devices. This kind of cooling fan can be seen in U.S. Pat. Nos. 6,799,282, 7,215,548, 7,286,357 and 7,568,517, for example.

As an example, a conventional heat dissipating device 1 shown in FIG. 1A is installed on a predetermined location of a circuit board, and comprises a printed circuit board 11, a housing 12 and a fan wheel set 13. The housing 12 has a base 120, a shaft sleeve 122 and a stator set 121 disposed around the shaft sleeve 122. The fan wheel set 13 has a hub 130, a magnet 131 located on an inner side of the hub 130, a plurality of blades 132 disposed around a periphery of the hub 130, and an shaft member 133 pivotally connected to the hub 130 and pivotally disposed in the shaft sleeve 122. The printed circuit board 11 has at least one control chip 110 and a plurality of passive elements 112 provided thereon. The printed circuit board 11 is disposed on the base 12 of the housing 120 to control the rotation of the fan wheel set 13 via the control chip 110, so that the rotation of the fan wheel set 13 can drive airflow.

The control chip 110 used in the conventional heat dissipating device 1 shown in FIG. 1A is a heat source. If heat generated by the control chip 10 cannot escape, it may lead to overheating and failing of the chip itself, which in turn will lead to the standstill of the fan wheel set 13. Thus, the heat generated by the electronic components on the main board of the electronic product cannot be dissipated effectively, resulting in failing or even damage of the electronic product. The control chip 110 is located just in a gap between the base 120 of the housing 12 and the hub 130 of the fan wheel set 13. The narrow gap often results in ineffective dissipation of the heat generated by the control chip 110, leading to overheating and damage of the control chip 110. The heat dissipating device 1 is a relative cheap component among the various components of the electronic product. However, if the heat dissipating device 1 cannot operate properly, it will damage the more expensive core component (the main board) of the electronic product, so its importance cannot be measured in terms of its price.

In addition, the provision of the control chip 110 will influence the size of the gap between the hub 130 of the fan wheel set 13 and the base 120 of the housing 12. An increase in the thickness of the control chip 110 very often requires an increase in the width of the gap, which is detrimental to the reduction of the overall height of the heat dissipating device 1. Moreover, the provision of the control chip 110 increases the footprint of the printed circuit board 11. If the area of the printed circuit board 11 is increased without increasing the cross-sectional area of this type of conventional heat dissipating device 1, then the area of the blades 132 will need to be reduced. However, a reduction in the area of the blades 132 will influence the airflow output. A lack of airflow output will affect the desired effect of heat dissipation.

In order to solve the problems, U.S. Pat. No. 7,345,884 proposed an improved cooling fan. As shown in FIG. 1B, the structure of a cooling fan 1' described in U.S. Pat. No. 7,345,884 is substantially the same as the structure of the prior art mentioned above. The difference is in that the printed circuit board 11' is formed with an extending part 11a that extends outwardly to allow the control chip 110' to be provided thereon, such that the control chip 110' is located entirely or partially outside the gap between the base 120' of the housing 12' and the hub 130' of the fan wheel set 13'. As such, the heat generated by the control chip 110' can be effectively removed by the airflow driven by the fan wheel set 13'.

However, the formation of the above outward extending part 11a of the printed circuit board 11' will interfere the airflow driven by the rotation of the fan wheel set 13'. Interfered airflow will generate noise, which in turn degrades the quality of the electronic product equipped with such kind of cooling fan 1'. Meanwhile, due to the outward extension of the extending part 11a, certain interval has to be kept between the blades 132' and the control chip 110'. This is also unfavorable to the reduction of the overall height of the conventional cooling fan 1', therefore failing to satisfy the needs for thinner electronic products.

Furthermore, the conventional cooling fan 1' still requires the printed circuit board 11' to be provided between the hub 130' of the fan wheel set 13' and the base 120' of the housing 12', so the thickness of the printed circuit board 11' will still affect the overall height of the cooling fan 1', which makes further thinning of the cooling fan 1' more difficult.

Therefore, overcoming aforementioned prior art problems is the current objective to be addressed.

SUMMARY OF THE INVENTION

In order to overcome the foregoing drawbacks, the present invention proposes a heat dissipating device, which include: a semiconductor packaging structure including a first surface, a second surface opposite to the first surface, side surfaces adjacent to the first and second surfaces, and a stator set and a semiconductor element provided therein; a fan wheel set pivotally connected with the semiconductor packaging structure and including a plurality of first blades located above the first surface of the semiconductor packaging structure and extending beyond the side surfaces of the semiconductor packaging structure and controlled by the stator set and the semiconductor element; and a guiding structure including a first receiving space, a second receiving space in communication with the first receiving space, and at least one guiding channel in communication with the first and second receiving spaces, wherein the semiconductor packaging structure is provided in the first receiving space, and the first blades are received in the second receiving space.

In an embodiment, the guiding channel includes a guiding mouth above blade faces of the first blades to form an axial flow channel. In another embodiment, the guiding channel includes a guiding mouth outside skirts of the first blades to form a radial flow channel.

When the heat dissipating device according to the present invention is in operation, since the first blades extend beyond the side surfaces of the semiconductor packaging structure and have their size increased, the volume of airflow can thus be increased. Further, by including the semiconductor packaging structure and the first blades in the guiding structure, airflow can be strengthened and noises are reduced. Therefore, in the heat dissipating device according to the present invention, the blades are not constrained by the size of the semiconductor packaging structure, so larger blades and guiding structure can be provided without changing the size of the semiconductor packaging structure, thereby increasing the volume of airflow.

Moreover, the stator set is embedded within the semiconductor packaging structure, thus the overall thickness of the heat dissipating device can be reduced.

In addition, the heat dissipating device according to the present invention does not require a housing with a bottom, and the semiconductor element is placed in the semiconductor packaging structure, so the semiconductor element does not need to be disposed between the base of the housing and the hub of the fan wheel set as in the prior art, thus avoiding the ineffective dissipation of heat generated by the semiconductor element.

In an embodiment, the heat dissipating device according to the present invention includes another fan wheel set that includes a plurality of second blades located above the second surface of the semiconductor packaging structure. In an embodiment, the second blades can also extend beyond the side surfaces of the semiconductor packaging structure, and the first blades and the second blades rotate at the same direction or at opposite directions. When the first blades and the second blades rotate at the same direction, the directions of airflow generated by the first and the second blades are consistent with each other, thereby airflow volume and wind pressure can be increased by merely providing the second blades without increasing the size of the semiconductor packaging structure. When the first blades and the second blades rotate at opposite directions, the vibrations generated by the fan wheel sets can be neutralized.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand other advantages and functions of the present invention after reading the disclosure of this specification.

It should be noted that the structures, proportions, sizes and the like shown in the attached drawings are to be considered only in conjunction with the contents of this specification to facilitate understanding and reading of those skilled in the art, and are not intended to limit the scope of present invention, thus they do not hold any real technically significance, and any changes or modifications in the structures, the proportions, the sizes and the like should fall within the scope of the technical contents disclosed in the present invention as long as they do not affect the effects and the objectives achieved by the present invention. Meanwhile, terms such as "above", "below", "top", "bottom", "first", "second" and "a/an" used in this specification are used for illustration purposes only, and are not intended to limit the scope of the present invention in any way, any changes or modifications of the relative relationships of elements are therefore to be construed as within the scope of the present invention as long as there is no substantial changes to the technical contents.

Figure 1A:
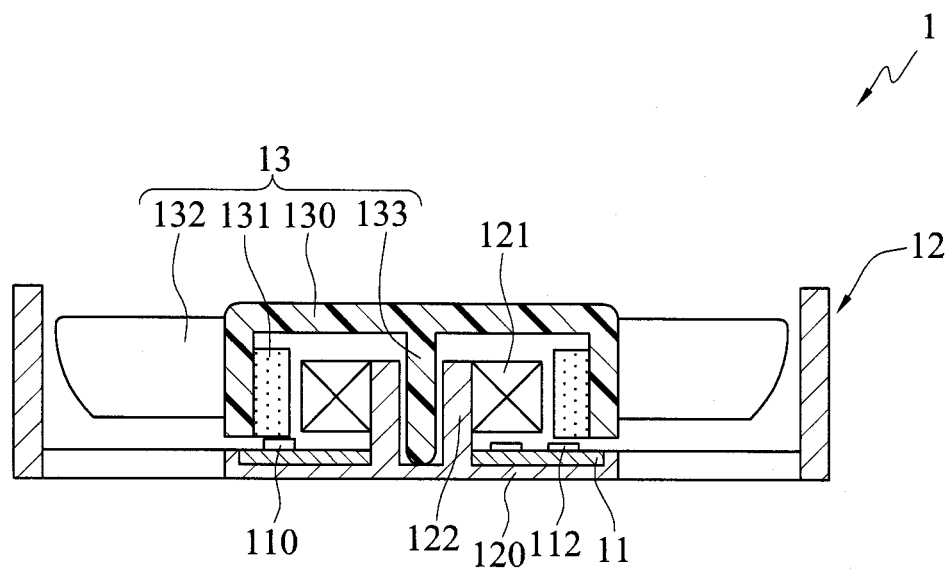
FIG. 1A is a cross-sectional diagram of a conventional cooling fan.
Figure 1B:
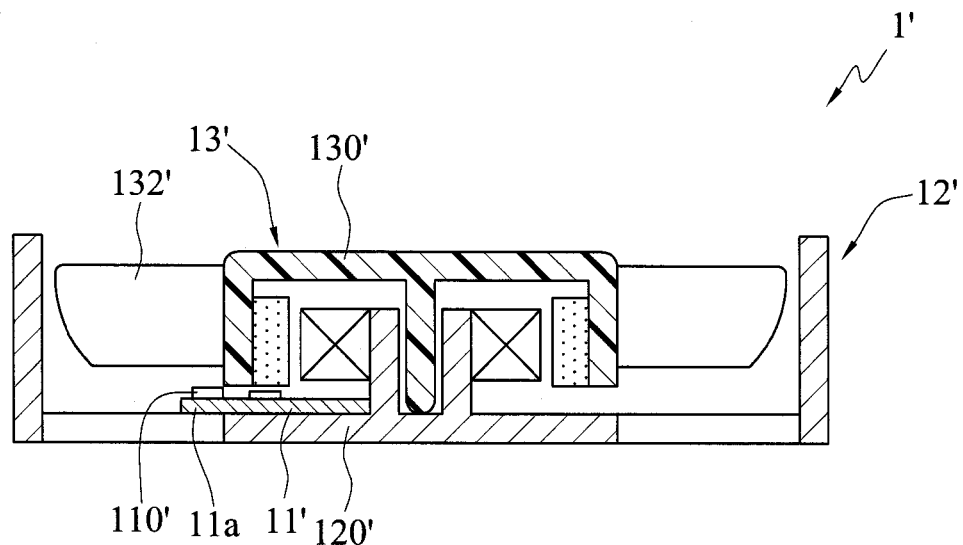
FIG. 1B is a cross-sectional diagram of a conventional cooling fan described in U.S. Pat. No. 7,345,884.
Figure 2:
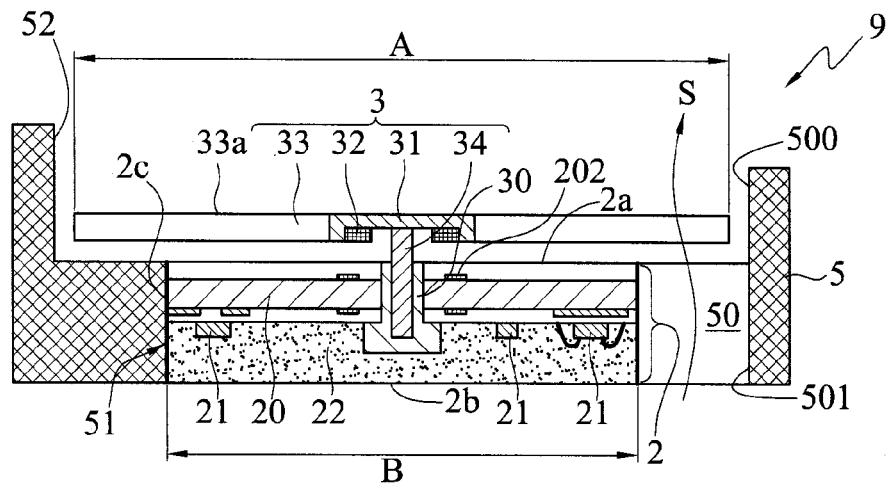
FIG. 2 is a cross-sectional diagram of a heat dissipating device in accordance with a first embodiment of the present invention, and FIG. 2' is a top view of FIG. 2.
Figure 2:
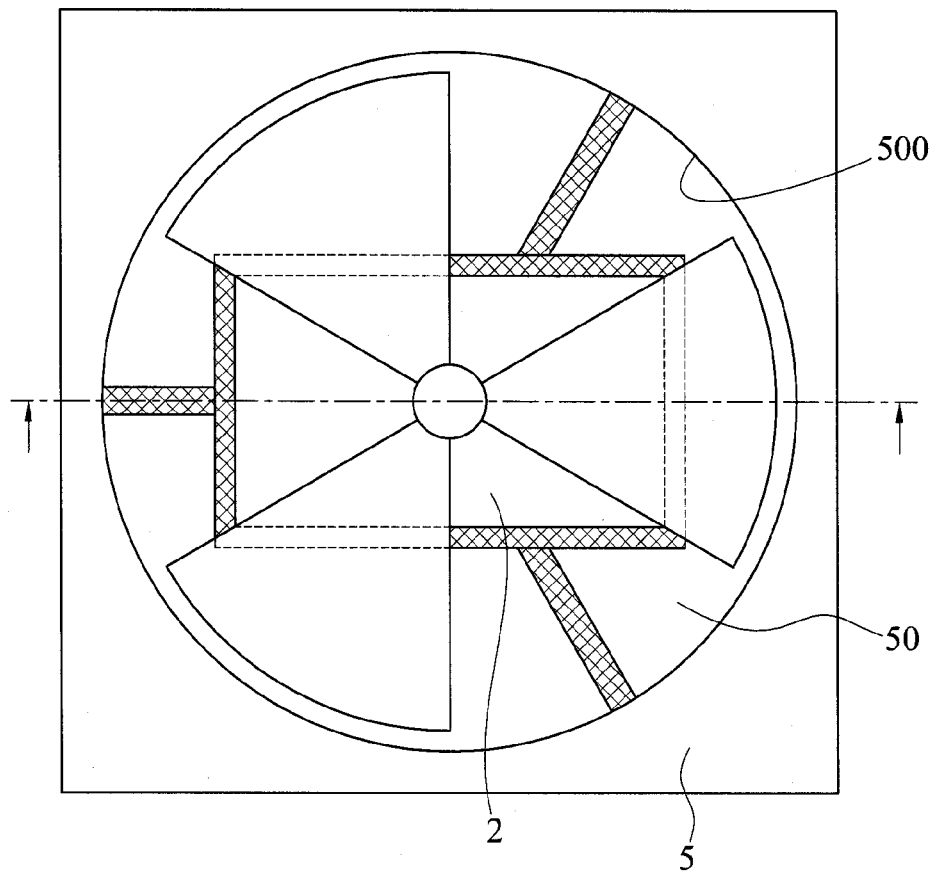

FIG. 2 is a cross-sectional schematic diagram depicting a heat dissipating device 9 in accordance with a first embodiment of the present invention. As shown in FIGS. 2 and 2', the heat dissipating device 9 includes a semiconductor packaging structure 2, a fan wheel set 3 and a guiding structure 5.

The semiconductor packaging structure 2 has a first surface 2a, a second surface 2b opposite to the first surface 2a, side surfaces 2c adjacent to the first and second surfaces 2a and 2b, and a stator set 202 and a plurality of semiconductor elements 21 provided therein.

In an embodiment, the semiconductor packaging structure 2 is a single semiconductor package, which further includes a substrate 20 and an encapsulant 22 formed on the substrate 20. The semiconductor elements 21 are provided on the substrate 20, and enclosed by an encapsulant 22. The stator set 202 is electrically connected to the substrate 20.

The fan wheel set 3 is pivotally connected to the first surface 2a of the semiconductor packaging structure 2.

In an embodiment, the fan wheel set 3 has a plurality of first blades 33 above the first surface 2a of the semiconductor packaging structure 2, a hub 31 on which the first blades 33 are provided, at least one sheet magnet 32 provided on the hub 31, and a shaft member 34 pivotally connected with the hub 31 and the semiconductor packaging structure 2.

Moreover, the first blades 33 extend beyond the side surfaces 2c of the semiconductor packaging structure 2, such that an overall occupied width A of the first blades 33 is greater than an overall width B of the first surface 2a.

In addition, the stator set 202 and the semiconductor element 21 control the actuation of the first blades 33, and the shaft member 34 can be pivotally connected to the semiconductor packaging structure 2 through a shaft sleeve 30 provided in the semiconductor packaging structure 2 that facilitates the rotation of the shaft member 34.

The guiding structure 5 has a first receiving space 51, a second receiving space 52 communicating with the first receiving space 51, and a guiding channel 50 connecting the first and the second receiving spaces 51 and 52. The semiconductor packaging structure 2 is provided in the first receiving space 51, and the fan wheel set 3 (especially the first blades 33) is received in the second receiving space 52.

In an embodiment, the first receiving space 51 has a first volume less than a second volume of the second receiving space 52. The guiding channel 50 is located adjacent the first receiving space 51 and communicates directly with the second receiving space 52. An entrance 501 of the guiding channel 50 extends upwardly from the bottom of the guiding structure 5, and a guiding mouth 500 of the guiding channel 50 is located above blade faces 33a of the first blades 33, thereby forming an axial flow channel, that is, the axial direction of the guiding channel 50 is in parallel with that of the shaft member 34 (or the shaft sleeve 30) and vertically runs through the guiding structure 5 to guide airflow S.

In an embodiment, the guiding structure 5 can be a frame structure, and the guiding mouth 500 of the guiding channel 50 fully exposes the first blades 33.

Further, the semiconductor packaging structure 2 is fixed in the first receiving space 51 of the guiding structure 5 by adhesion (e.g., with adhesive) or some mechanical mechanisms (e.g., embedding, locking, wedging, etc.), such that the second surface 2b of the semiconductor packaging structure 2 is exposed from the bottom of the guiding structure 5.

The heat dissipating device 9 according the present invention does not require a housing with a bottom, and the semiconductor element 21 is placed in the semiconductor packaging structure 2, so the semiconductor element 21 does not need to be disposed between the base of the housing and the hub of the fan wheel set as in the prior art, thus avoiding the ineffective dissipation of heat generated by the semiconductor element 21.

When the heat dissipating device 9 is in operation, the resulting air volume is increased by the larger first blades 33, and the semiconductor packaging structure 2 and the first blades 33 are received in the guiding structure 5. This strengthens airflow while reducing noises. Thus, in the heat dissipating device 9, first blades 33 and guiding structures 5 of any sizes can be provided without changing the size of the semiconductor packaging structure 2 to increase the airflow volume.

A method of fabricating the semiconductor packaging structure 2 shown in FIG. 2 is illustrated in FIGS. 2A to 2E.

Figure 2A:
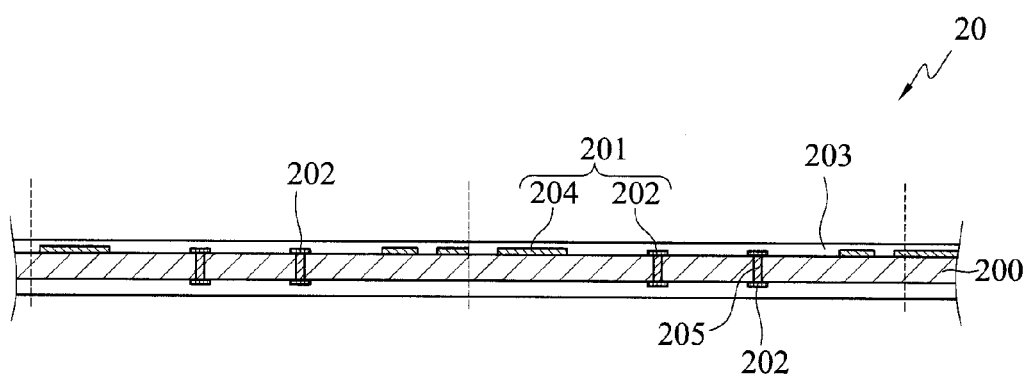
FIGS. 2A to 2E are cross-sectional diagrams illustrating a method of fabricating the semiconductor packaging structure of FIG. 2, and FIGS. 2B' and 2B" are top and bottom views of FIG. 2B, respectively.

In FIG. 2A, a substrate 20 is provided. The substrate 20 includes a core layer 200, circuit layers 201 formed above and below the core layer 200, and protective layers 203 covering the circuit layers 201. In an embodiment, the circuit layers 201 include conductive circuits 204 and the stator set 202. The conductive circuits 204 and the stator set 202 can be formed at the same time or separately. The protective layers 202 can take the form of solder masks.

In an embodiment, the stator set 202 further includes conductive vias 205 penetrating the core layer 200. The methods of fabricating the conductive circuits 204 and the stator set 202 can be, but not limited to, standard wire patterning techniques. Since the stator set 202 is formed on the substrate 20 in the form of circuits, the overall thickness of the semiconductor packaging structure 2 can be reduced.

Figure 2B:
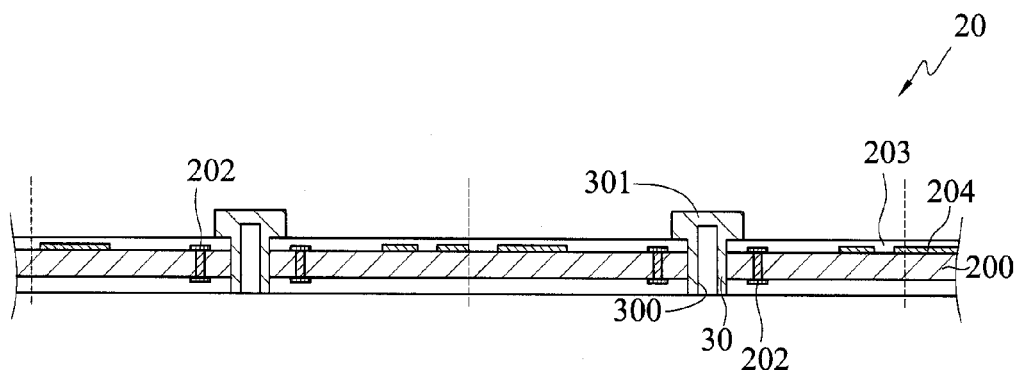

As shown in FIG. 2B, a plurality of through holes penetrating the substrate 20 are formed, so that a shaft sleeve 30 can be provided in each of the through holes for subsequent insertions of the shaft member 34 of the fan wheel set 3.

In an embodiment, the location of the shaft sleeve 30 can be designed according to needs, such that the fan wheel set 3 can be connected to the semiconductor packaging structure 2 coaxially or eccentrically. For example, if the shaft sleeve 30 is inserted in the substrate 20 off center, then there are more space on the surface of the substrate 20 to accommodate more semiconductor elements 21 (e.g., functional chips) or other electronic components.

Furthermore, a protruding end 301 of the shaft sleeve 30 protrudes out of the substrate 20 and wedges on the top surface of the substrate 20, while an inserting hole 300 of the shaft sleeve 30 is exposed from the bottom surface of the substrate 20.

Furthermore, as shown in FIGS. 2B' and 2B'', the stator set 202 may be provided around the periphery of the shaft sleeve 30, and the shaft sleeve 30 is located at the center of the stator set 202.

In an embodiment, the stator set 202 may include two sets of first spiral circuits 2021 and 2021' (shown in FIG. 2B') on the top surface of the substrate 20 and two sets of second spiral circuits 2022 and 2022' (shown in FIG. 2B'') on the bottom surface of the substrate 20, and the first spiral circuits 2021 and 2021' and the second spiral circuits 2022 and 2022' are electrically connected by the conductive vias 205. During operation, adjacent spiral circuits will create magnetic fields of opposite polarities when a current passes through them (for example, adjacent first spiral circuits 2021 and 2021' will have magnetic fields of opposite polarities), and the first spiral circuits 2021 and the second spiral circuits 2022 vertically opposite to each other will have the magnetic fields of the same polarity when a current passes through them. Likewise, the first spiral circuits 2021' and the second spiral circuits 2022' vertically opposite to each other will have the magnetic fields of the same polarity.

Figure 2C:
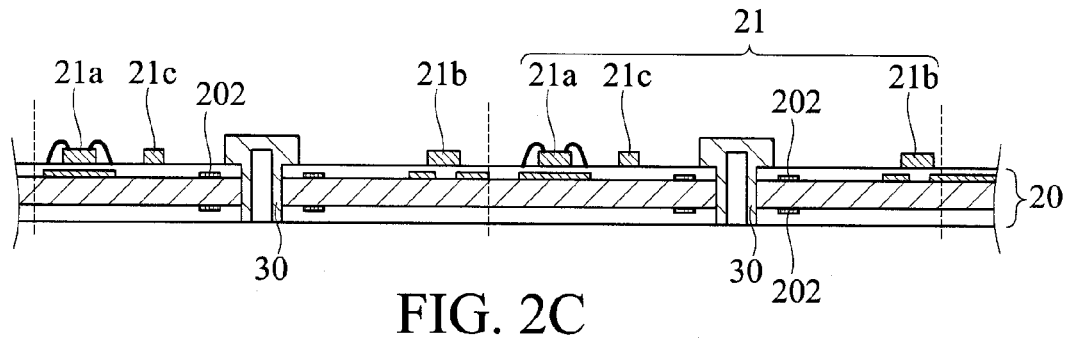

As shown in FIG. 2C, a plurality of semiconductor elements 21 and electronic components (not shown) are provided on the top surface of the substrate 20. In an embodiment, a semiconductor element 21 may include a control chip 21a, a passive element 21b, or a functional chip 21c such as a graphics chip or display chip. The control chip 21a is used for transmitting control signals to the stator set 202 so as to drive the fan wheel set 3.

Figure 2D:
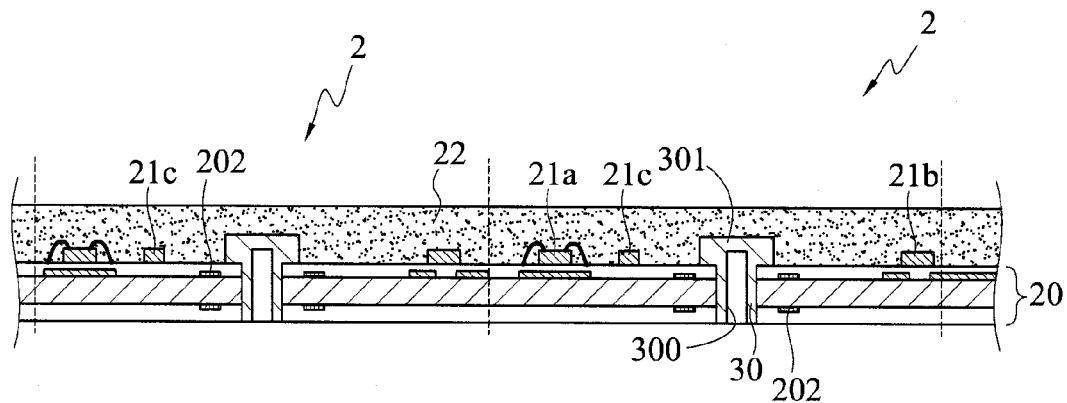

As shown in FIG. 2D, an encapsulant 22 is formed on the top surface of the substrate 20 to enclose the semiconductor elements 21, the electronic components, and the protruding ends of the shaft sleeves 30. The inserting holes 300 of the shaft sleeves 30 are exposed from the bottom surface of the substrate 20.

The present invention may reduce the thickness of the overall device after the installation of the fan wheel set 3 by controlling the thickness of the encapsulant 22, thereby meeting the needs for thinner electronic products.

Figure 2E:
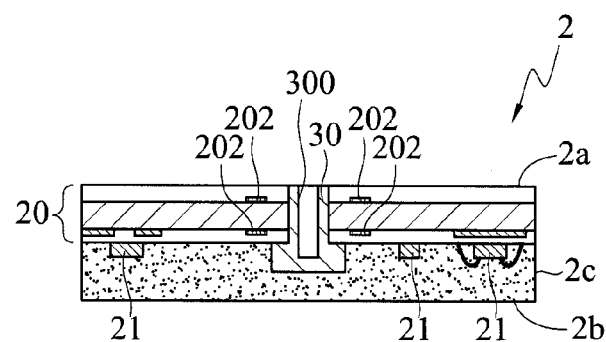

As shown in FIG. 2E, the substrate 20 is singulated along the dotted lines shown in FIG. 2D to obtain a plurality of semiconductor packaging structures 2 (FIG. 2E is a view after flipping over FIG. 2D and singulation), and the fan wheel set 3 and the guiding structure 5 are assembled in subsequent assembly processes.

Figure 3:
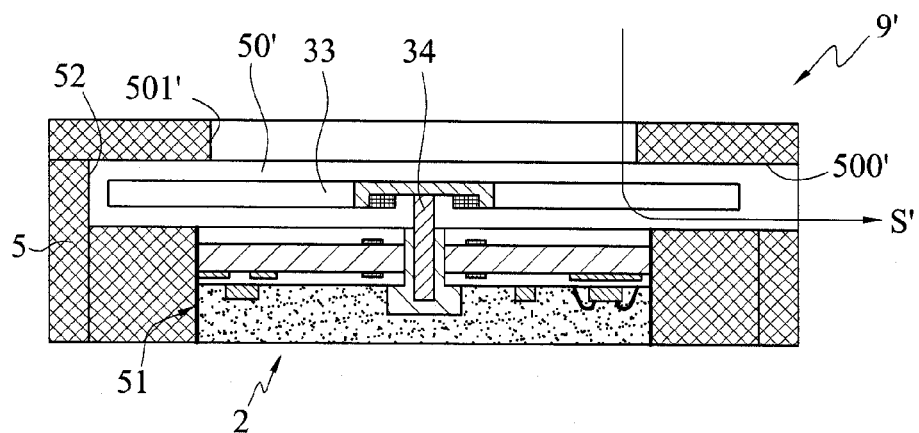
FIG. 3 is a cross-sectional diagram of a heat dissipating device in accordance with a second embodiment of the present invention, and FIG. 3' is a top view of FIG. 3.
Figure 3:
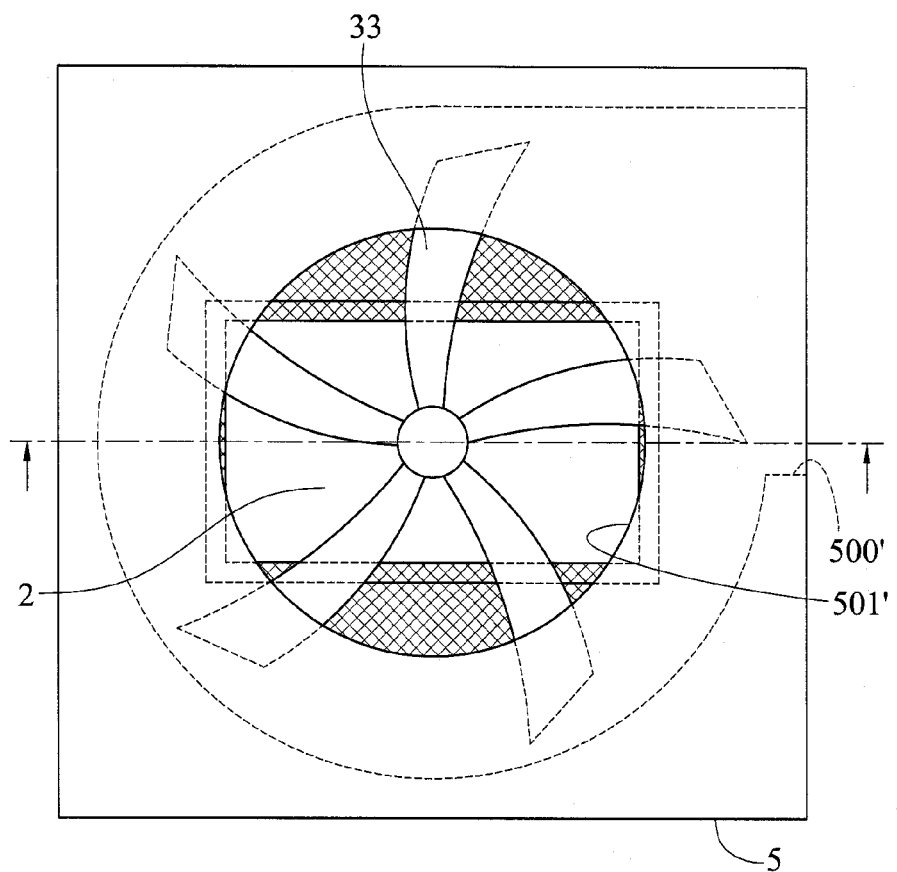

FIG. 3 is a cross-sectional schematic diagram depicting a heat dissipating device 9' in accordance with a second embodiment of the present invention. The second embodiment is different from the first embodiment in the design of the guiding structure, whereas the remaining structures are substantially the same and further description will be omitted.

As shown in FIGS. 3 and 3', the entrance 501' of the guiding channel 50' communicates with the first and second receiving spaces 51 and 52 from the top of the guiding structure 5'. The second receiving space 52 of the guiding channel 50' extends to the right to communicate with outside, such that the guiding mouth 500' is located outside the skirt of the first blades 33, thereby forming a radial flow channel. In other words, a portion of the guiding channel 50' is parallel to the radius of the first blades 33 (i.e., perpendicular to the axis of the shaft member 34) to guide airflow S' coming in from the top to flow out from the side.

In an embodiment, the entrance 501' of the guiding channel 50' exposes a portion of the first blades 33.

Figure 4:
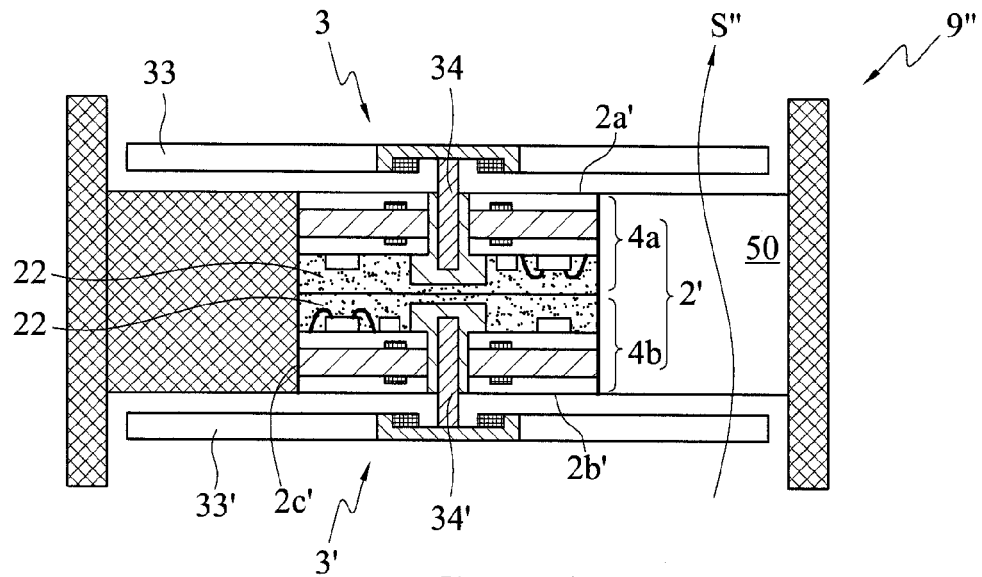
FIG. 4 is a cross-sectional diagram of a heat dissipating device in accordance with a third embodiment of the present invention, and FIG. 4' is a top view of FIG. 4.
Figure 4:
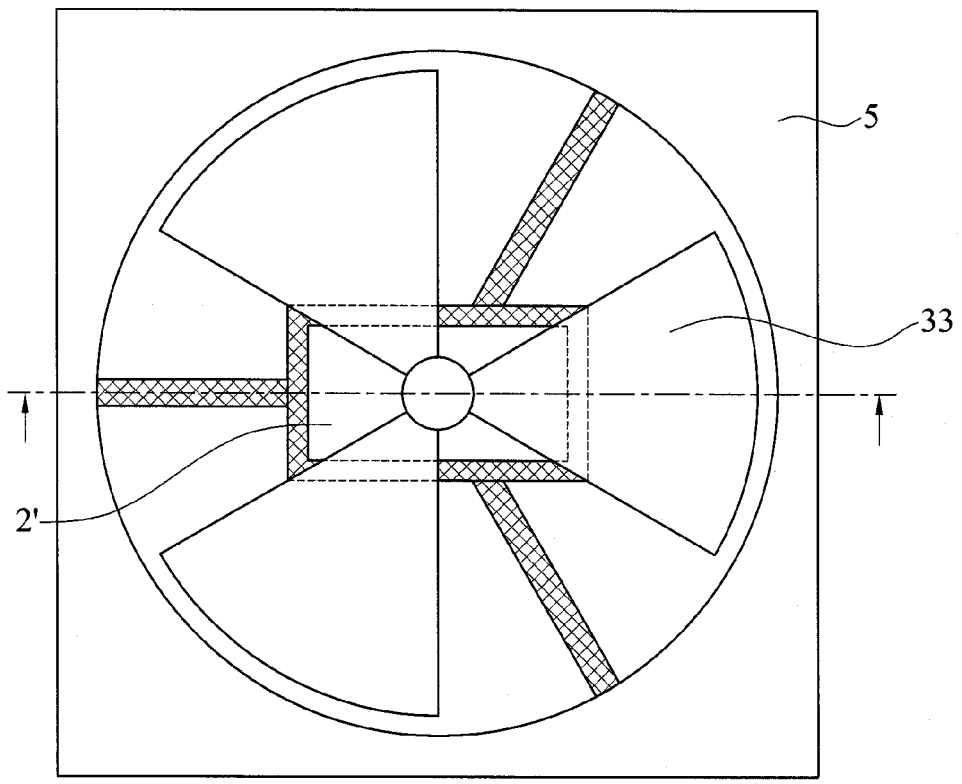

FIG. 4 is a cross-sectional schematic diagram depicting a heat dissipating device 9'' in accordance with a third embodiment of the present invention. The third embodiment is different from the first embodiment in the design of the semiconductor packaging structure and the fan wheel set, whereas the remaining structures are substantially the same and further description is hereby omitted.

As shown in FIGS. 4 and 4', the semiconductor packaging structure 2' includes two semiconductor packages 4a and 4b, and the structure of the two semiconductor packages 4a and 4b are the same as the semiconductor packaging structure 2' shown in FIG. 2E. The two semiconductor packages 4a and 4b are stacked together at the side surfaces of their encapsulant 22.

In an embodiment, there are two fan wheel sets. One of the fan wheel sets 3 includes first blades 33 installed on the first surface 2a' of the semiconductor packaging structure 2', while the other of the fan wheel sets 3 includes second blades 33' installed on the second surface 2b' of the semiconductor packaging structure 2'. The second blades 33' extend beyond the side surfaces 2c' of the semiconductor packaging structure 2'. In an embodiment, the semiconductor packages 4a and 4b are pivotally connected to shaft member 34 and 34', respectively, in order to install the first blades 33 and the second blades 33' on the semiconductor packages 4a and 4b, respectively.

Furthermore, when viewed from the top of the first surface 2a' towards the second surface 2b', as shown in FIG. 4', when the first blades 33 and the second blades 33' rotate at the same direction (e.g., both rotates clockwise), the directions of airflows S'' generated by the first blades 33 and the second blades 33' are the same, such that the airflow volume can be increased without changing the size of the semiconductor packaging structure. On the other hand, when the first blades 33 and the second blades 33' rotate at opposite direction (e.g., one rotates clockwise while the other rotates anticlockwise), since the directions of mechanical rotation of the two shaft members 34 and 34' of the fan wheel sets 3 and 3' are opposite, the torques generated by the rotation of the upper shaft member 34 and the lower shaft member 34' can be neutralized, thereby reducing the vibrations produced when the heat dissipating device 9'' according to the present invention is in operation.

In other embodiments, the two semiconductor packages 4a and 4b have different structures and may also be arranged side by side, and the first blades 33 and the second blades 33' may also be placed on the same side (e.g., both on the first surface 2a).

In the heat dissipating device according to the present invention, by increasing the size of the blades, and allowing the blades to extend beyond the side surfaces of the semiconductor packaging structure, the volume of airflow can be increased. By including the design of the guiding structure, airflow can be strengthened and noise reduced.

In addition, since the volume of the first receiving space is smaller than the volume of the second receiving space, the size of the blades of the fan wheel set is not constrained by the size of the semiconductor packaging structure.

The above embodiments are only used to illustrate the principles of the present invention, and should not be construed as to limit the present invention in any way. The above embodiments can be modified by those with ordinary skill in the art without departing from the scope of the present invention as defined in the following appended claims.

What is claimed is:

1. A heat dissipating device, comprising:
   a semiconductor packaging structure including a first surface, a second surface opposite to the first surface, side surfaces adjacent to the first and second surfaces, and a stator set and a semiconductor element provided therein;
   a fan wheel set pivotally connected with the semiconductor packaging structure and including a plurality of first blades located above the first surface of the semiconductor packaging structure and extending beyond the side surfaces of the semiconductor packaging structure and controlled by the stator set and the semiconductor element; and
   a single piece unitary guiding structure including a first receiving space, a second receiving space in communication with the first receiving space, and at least one guiding channel in communication with the first and second receiving spaces,
   wherein the semiconductor packaging structure is provided in the first receiving space, and the first blades are received in the second receiving space.

2. The heat dissipating device of claim 1, wherein the semiconductor packaging structure further comprises a substrate and an encapsulant formed on a top surface of the substrate, the semiconductor element is provided on the substrate and covered by the encapsulant, and the stator set is electrically connected to the substrate.

3. The heat dissipating device of claim 1, wherein the first receiving space has a first volume less than a second volume of the second receiving space.

4. The heat dissipating device of claim 1, wherein entire side surfaces of the semiconductor packaging structure are fixed to the first receiving space of the guiding structure by adhesion or mechanical means, and the second surface of the semiconductor packaging structure is exposed from a bottom of the guiding structure.

5. The heat dissipating device of claim 1, wherein the guiding channel includes a guiding mouth above blade faces of the first blades to form an axial flow channel.

6. The heat dissipating device of claim 1, wherein the guiding channel includes a guiding mouth outside skirts of the first blades to form a radial flow channel.

7. The heat dissipating device of claim 1, wherein the fan wheel set further comprises a hub on which the first blades are provided, a magnet provided on the hub, and an shaft member pivotally connecting the hub and the semiconductor packaging structure.

8. The heat dissipating device of claim 1, further comprising another fan wheel set including a plurality of second blades located above the second surface of the semiconductor packaging structure.

9. The heat dissipating device of claim 8, wherein the second blades extend beyond the side surfaces of the semiconductor packaging structure.

10. The heat dissipating device of claim 8, wherein the first blades and the second blades rotate at the same direction.

11. The heat dissipating device of claim 8, wherein the first blades and the second blades rotate at opposite directions.

* * * * *